(12) United States Patent
Kunert et al.

(10) Patent No.: US 11,655,558 B2
(45) Date of Patent: May 23, 2023

(54) METHODS FOR IMPROVED III/V NANO-RIDGE FABRICATION ON SILICON

(71) Applicant: IMEC VZW, Leuven (BE)

(72) Inventors: Bernardette Kunert, Wilsele (BE); Robert Langer, Heverlee (BE); Yves Mols, Wijnegem (BE); Marina Baryshnikova, Leuven (BE)

(73) Assignee: Imec VZW, Leuven (BE)

( * ) Notice: Subject to any disclaimer, the term of this patent is extended or adjusted under 35 U.S.C. 154(b) by 0 days.

(21) Appl. No.: 16/996,146

(22) Filed: Aug. 18, 2020

(65) Prior Publication Data

US 2021/0062360 A1 Mar. 4, 2021

(30) Foreign Application Priority Data

Sep. 3, 2019 (EP) .................................... 19195256

(51) Int. Cl.
*C30B 25/04* (2006.01)
*C30B 25/10* (2006.01)
(Continued)

(52) U.S. Cl.
CPC ............ *C30B 25/04* (2013.01); *C30B 25/105* (2013.01); *C30B 25/18* (2013.01); *C30B 29/42* (2013.01);
(Continued)

(58) Field of Classification Search
CPC ......... C30B 25/00; C30B 25/02; C30B 25/04; C30B 25/10; C30B 25/105; C30B 25/16;
(Continued)

(56) References Cited

U.S. PATENT DOCUMENTS

| 7,229,498 B2 | 6/2007 | Norman et al. |
| 9,324,900 B2 | 4/2016 | Evans et al. |
| | (Continued) | |

FOREIGN PATENT DOCUMENTS

| CN | 103367567 B | 7/2016 |
| WO | 2017171875 A1 | 10/2017 |
| | (Continued) | |

OTHER PUBLICATIONS

B. Kunert, et al. publication entitled "III/V nano ridge structures for optical applications on patterned 300 mm silicon substrates," Applied Physics Letters, vol. 109, pp. 091101-1 to 091101-5 (2016). (Year: 2016).*

(Continued)

*Primary Examiner* — Kenneth A Bratland, Jr.
(74) *Attorney, Agent, or Firm* — McDonnell Boehnen Hulbert & Berghoff LLP

(57) ABSTRACT

A method for growing at least one III/V nano-ridge on a silicon substrate in an epitaxial growth chamber. The method comprises: patterning an area on a silicon substrate thereby forming a trench on the silicon substrate; growing the III/V nano-ridge by initiating growth of the III/V nano-ridge in the trench, thereby forming and filling layer of the nano-ridge inside the trench, and by continuing growth out of the trench on top of the filling layer, thereby forming a top part of the nano-ridge, wherein at least one surfactant is added in the chamber when the nano-ridge is growing out of the trench.

20 Claims, 3 Drawing Sheets

(51) Int. Cl.
  *C30B 25/18* (2006.01)
  *C30B 29/42* (2006.01)
  *C30B 29/60* (2006.01)
  *H01L 21/762* (2006.01)
  *H01L 21/768* (2006.01)

(52) U.S. Cl.
  CPC ........ *C30B 29/60* (2013.01); *H01L 21/76224* (2013.01); *H01L 21/76877* (2013.01)

(58) Field of Classification Search
  CPC ....... C30B 25/18; C30B 25/186; C30B 29/00; C30B 29/10; C30B 29/40; C30B 29/42; C30B 29/60; H01L 21/76224; H01L 21/76877
  USPC .... 117/84, 88–90, 94–95, 97, 102, 105–106, 117/937, 954
  See application file for complete search history.

(56) References Cited

U.S. PATENT DOCUMENTS

| | | | |
|---|---|---|---|
| 9,431,243 B2 | 8/2016 | Lochtefeld et al. | |
| 10,243,063 B2 | 3/2019 | Yan et al. | |
| 2011/0215275 A1 | 9/2011 | Stringfellow et al. | |
| 2013/0078783 A1* | 3/2013 | Nieh | H01L 21/76224 257/E21.546 |
| 2015/0037925 A1* | 2/2015 | Evans | H01L 31/035236 438/94 |
| 2017/0204533 A1* | 7/2017 | Schunemann | C30B 25/12 |
| 2018/0033872 A1* | 2/2018 | Bao | H01L 21/02579 |

FOREIGN PATENT DOCUMENTS

| | | |
|---|---|---|
| WO | 2018095020 A1 | 5/2018 |
| WO | 2018182693 A1 | 10/2018 |

OTHER PUBLICATIONS

Extended European Search Report and Written Opinion, EP Application No. 19195256.3, dated Feb. 17, 2020, 9 pages.

Orzali, Tommaso, Alexey Vert, Brendan O'Brian, Joshua L. Herman, Saikumar Vivekanand, Satyavolu S. Papa Rao, and Serge R. Oktyabrsky. "Epitaxial growth of GaSb and InAs fins on 300 mm Si (001) by aspect ratio trapping." Journal of Applied Physics 120, No. 8 (2016): 085308.

Kunert, B., W. Guo, Y. Mols, Bin Tian, Zhechao Wang, Yuting Shi, Dries Van Thourhout et al. "III/V nano ridge structures for optical applications on patterned 300 mm silicon substrate." Applied Physics Letters 109, No. 9 (2016): 091101.

Kunert, B., R. Langer, M. Pantouvaki, J. Van Campenhout, and Dries Van Thourhout. "Gaining an edge with nano-ridges." Compound Semiconductor 24, No. 5 (2018): 36-41.

Ok, Jin Eun, Dong Wan Jo, Wy Il Jo, Young Hun Han, Hun Soo Jeon, Gang Suok Lee, Se Gyo Jung, Seon Min Bae, Hyung Soo Ahn, and Min Yang. "Addition of Sb as a surfactant for the growth of nonpolar a-plane GaN by using mixed-source hydride vapor phase epitaxy." Journal of the Korean Physical Society 58, No. 5 (2011): 1146-1150.

Paisley, Elizabeth A., Mark D. Losego, Benjamin E. Gaddy, James S. Tweedie, Ramón Collazo, Zlatko Sitar, Douglas L. Irving, and Jon-Paul Maria. "Surfactant-enabled epitaxy through control of growth mode with chemical boundary conditions." Nature communications 2, No. 1 (2011): 1-7.

Anyebe, E. A., Mohana K. Rajpalke, Tim D. Veal, C. J. Jin, Z. M. Wang, and Q. D. Zhuang. "Surfactant effect of antimony addition to the morphology of self-catalyzed InAs 1-x Sb x nanowires." Nano Research 8, No. 4 (2015): 1309-1319.

* cited by examiner

METHODS FOR IMPROVED III/V NANO-RIDGE FABRICATION ON SILICON

CROSS-REFERENCE TO RELATED APPLICATIONS

The present application is a non-provisional patent application claiming priority to European Patent Application No. EP 19195256.3, filed Sep. 3, 2019, the contents of which are hereby incorporated by reference.

FIELD OF THE DISCLOSURE

The present description relates to the field of III-V semiconductors. More specifically it relates to a method for monolithically integrating III-V devices on a silicon substrate.

BACKGROUND

Monolithically integrating III-V devices on a silicon substrate is difficult because of the lattice mismatch between the III-V material and the silicon substrate as this results in defects in the III-V material. In order to overcome these difficulties nano-ridges are grown in a narrow trench.

Nano-ridges made of III/V materials are currently used for very different integration approaches. These nano-ridges are for example InGaAs nano-ridges (with different In-content) grown on a patterned silicon substrate. The patterned substrate may be obtained using a shallow trench isolation process flow. The nano-ridges are obtained by filling and overgrowing the trenches. Successful device integration on these nano-ridges requires a collinear and uniform nano-ridge growth on patterned Si wafers with a pronounced flat (001) top surface. Nano-ridge engineering is required to obtain such a pronounced flat (001) top surface.

Depending on the growth condition very different kinds of shapes can be realized. An example of a cross-section scanning electron microscopy image of nano-ridges is shown in FIG. 2. It shows nano-ridges 10 grown in trenches in a dielectric layer 21. The dielectric layer 21 is present on the silicon substrate 22. A first part 12 of the nano-ridge 10 is grown in the trench and a second part 11 of the nano-ridge is overgrown outside the trench. In the example the nano-ridge comprises InGaAs. By exploiting the aspect ratio trapping technique, defects resulting from the lattice mismatch between Si and InGaAs can be confined in the trenches. As can be seen from this figure the nano-ridges do not comprise a flat top surface. This is problematic for device integration.

In order to obtain a nano-ridge with a flat top surface, the nano-ridge is formed by applying low growth temperatures and/or high growth rates. Thus, a box-shaped InGaAs with a (001) top surface can be realized. However, remaining strain fields, typical in hetero-epitaxy of III/V on Si, lead to a non-uniform InGaAs nano-ridge formation with a rough top surface, which is problematic for any device integration.

There is therefore a need for methods which allow growing III/V materials on a silicon substrate in order to compensate for the lattice mismatch between the III-V materials and silicon.

SUMMARY

The present embodiments relate to a method for growing at least one III/V nano-ridge on a silicon substrate. The above objective is accomplished by a method and device according to the present embodiments. For growing the nano-ridge, the substrate may be placed in an epitaxial growth chamber where the growing conditions can be controlled. The method comprises patterning an area on a silicon substrate thereby forming a trench on the silicon substrate; and growing the at least one III/V nano-ridge by: initiating growth of the at least one III/V nano-ridge in the trench, thereby forming a filling layer on the at least one III/V nano-ridge nano-ridge inside the trench; this may be achieved by forming a III/V seed layer on top of the Si surface inside the trench, and by continuing growth inside the trench to fill the trench thereby obtaining the filling layer; and continuing growth out of the trench on top of the filling layer, thereby forming a top part of the nano-ridge, wherein at least one surfactant is added in the chamber when the nano-ridge is growing out of the trench.

In some embodiments, a surfactant is added when continuing the growth out of the trench. This surfactant changes the properties on the crystal surface and hence the growth characteristics. In some embodiments using the surfactant nano-ridges with a flat (001) surface can be formed at a higher temperature than would be the case if no surfactant would be used. Thus, funnel shaped or box shaped III/V nano-ridges can be formed at high growth temperatures. The temperature may for example be higher than 400° C., for example higher than 500° C.

In some embodiments, the amount of surfactant and the exposure time to the nano-ridge is limited such that the surfactant changes the growth characteristics but is not incorporated in a significant amount in the nano-ridge. In some embodiments, the at least one surfactant is only added when continuing the growth out of the trench.

Although the growth of III/V nano-ridges with a flat (001) surface is possible at low growth temperature this leads easily to non-uniform nano-ridges with a rough top (001) surface, because of the low temperature growth. This is may be problematic for device integration. Therefore the growth temperature can be increased by adding the surfactant, while still forming the flat (001) surface.

Some embodiments enable the hetero-epitaxial integration of collinear and uniform III/V nano-ridges on patterned Si substrates with a pronounced and smooth (001) surface for device integration.

In some embodiments, strain induced defects, initiated by the lattice mismatch between the III/V material and Si, are trapped at the pattern side walls of the trenches close to the III/V-Si surface. Therefore, the overgrown top III/V material may have a significantly reduced defect density.

In some embodiments, multi-functionalities may be implemented on one substrate. Applications are, amongst others, in Silicon Photonics, analog RF applications, imagers, etc. III/V based device functionalities can be integrated with Si-based integrated electronics.

In some embodiments, the temperature in the epitaxial growth chamber is set to 400° C. or higher when growing the nano-ridge on top of the filling layer.

In some embodiments, the nano-ridge is grown using metal organic vapor phase epitaxy.

In some embodiments, the nano-ridge is grown using hydride vapor phase epitaxy.

In some embodiments, the nano-ridge is grown using molecular beam epitaxy.

In some embodiments, the III/V nano-ridge comprises a ternary material system comprising $In_xGa_{(1-x)}As$ wherein x goes from zero to 1, thus also covering pure GaAs and pure InAs.

In some embodiments, the III/V nano-ridge comprises a quaternary material system.

In some embodiments, the at least one surfactant is selected from a list of surfactants, the list comprising gallium-precursors, indium precursors, silicon precursors, tertiarybutylarsine, arsine gas, antimony precursors, bismuth precursors, tellurium precursors, zinc precursors, magnesium precursors, manganese precursors, tin precursors such as tin chloride, hydrogen chloride, carbon tetrabromide, chlorine gas, bromochloromethanes (e.g. $CCl_3Br$, $CCl_2Br_2$ and $CClBr_3$), carbon tetrachloride.

In some embodiments, the method further comprises forming an RF device in the at least one nano-ridge.

In some embodiments, the method further comprises forming an optical device in the at least one nano-ridge.

In some embodiments, the method further comprises forming an imager in the at least one nano-ridge.

Particular aspects of the embodiments are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

Figure 1:
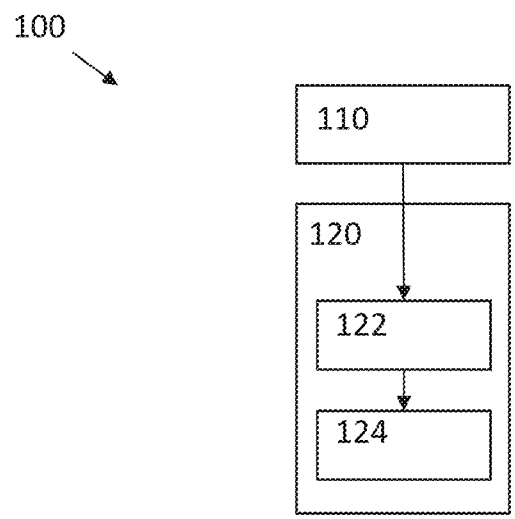
FIG. 1 shows a flow chart of an exemplary method in accordance with an example embodiment.
Figure 2:
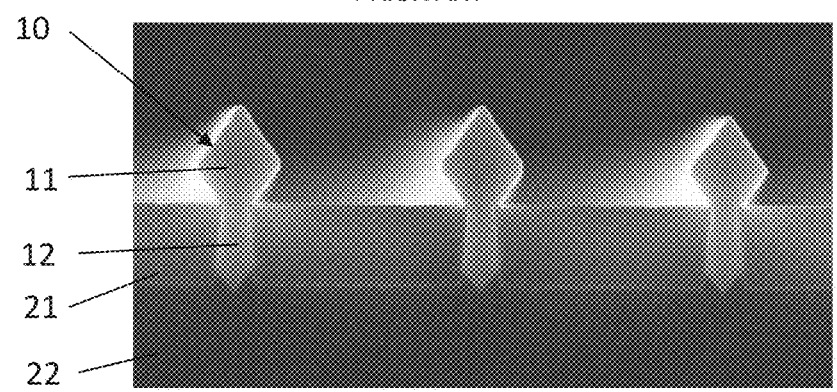
FIG. 2 shows a cross-section scanning electron microscopy image of InGaAs nano-ridges on a Si substrate in accordance with an example embodiment.

Any reference signs in the claims shall not be construed as limiting the scope.

In the different drawings, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The drawings described are only schematic and are non-limiting. In the drawings, the size of some of the elements may be exaggerated and not drawn on scale for illustrative purposes. The dimensions and the relative dimensions do not correspond to actual reductions to practice of the embodiments.

Moreover, the terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiments, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed embodiments requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

Figure 3:
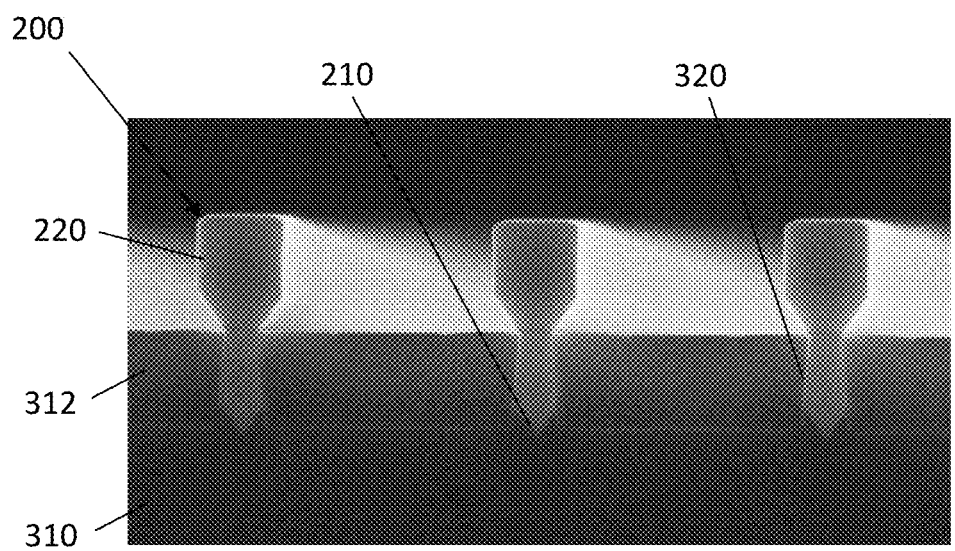
FIG. 3 shows a cross-section scanning electron microscopy image of nano-ridges obtained using a method in accordance with an example embodiment.

Example embodiments relate to a method 100 for growing at least one III/V nano-ridge 200 on a silicon substrate 310. The method comprises patterning 110 an area on a silicon substrate 310 thereby forming a trench 320 on the silicon substrate. The method, moreover, comprises growing 120 the III/V nano-ridge 200. For growing the nano-ridge the substrate is placed in a chamber where the growing conditions can be controlled. Growing of the nano-ridge is done by initiating growth 122 of the III/V nano-ridge 200 in the trench 320. Thereby a filling layer 210 is formed inside the trench. This may be achieved by initiating the III/V nucleation on the Si surface followed by filling the trench. Initiating the III/V nucleation may thereby be done at different growth conditions than filling the trench. The thickness of the seed layer may for example range between 5 and 30 nm. The method moreover comprises continuing growth 124 of the nano-ridge out of the trench 320 on top of the filling layer 210 of the nano-ridge. Thereby a top part 220 of the nano-ridge 200 is formed. One or more surfactants are added in the chamber when the nano-ridge is growing out of the trench. A flow chart of an exemplary method in accordance with embodiments is illustrated in FIG. 1. It shows the steps of patterning 110, growing the nano-ridge 120 comprising the steps of initiating the growth 122 by forming the filling layer and continuing the growth 124 on top of the filling layer and out of the trench. An example of a cross-section scanning electron microscopy image of nano-ridges obtained using a method in accordance with embodiments is shown in FIG. 3. It shows III/V nano-ridges 200 on a silicon substrate 310. It also shows a dielectric layer 312 with trenches 320 therein. In the trenches 320 the filling layer 210 of the nano-ridges is present. For each of the nano-ridges a top part 220 of the nano-ridge 200 is present on top of the filling layer 210. These top parts are grown out of the trenches.

By starting the growth of the nano-ridge inside the trench, defects due to the lattice mismatch are confined to the trench because releasing of the strain due to the lattice mismatch takes place inside the trench. In some embodiments, the depth of the trench is greater than the width of the trench.

By adding the surfactant when continuing growth 124 of the nano-ridge out of the trench 320 the growth characteristics of the nano-ridge are changed. This allows the formation of nano-ridges with an increased (001) surface and this even at growth temperatures which are higher than would be the case if no surfactant is used. For example a funnel-shaped or a box-shaped III/V nano-ridge (binary or ternary III/V nano-ridges such as for example InGaAs) may be formed at growth temperatures which are higher than would be the case if no surfactant is used. In some embodiments the growth temperature can be higher than the temperature when no surfactant is used. The temperature can for example be above 400° C. when growing the nano-ridge on top of the filling layer. Without being bound by theory it is assumed that the surfactants applied in this embodiment are decreasing the mobility of the group-III and group-V atoms as well as partly decomposed and adsorbed precursors molecules on the surface. By increasing the temperature, the relaxation in the trench is improved but also the mobility of atoms and molecules on the surface.

A surfactant, which increases the desorption rate on the surface, e.g. by etching atoms and molecules, changes the growth characteristics on the different facets. Hence, the growth rate hierarchy is manipulated by the surfactant, which promotes the evolution of a box-shaped nano-ridge or a nano-ridge with a wide (100) surface.

By adding the surfactant it is possible to maintain the high temperature budget also when growing out of the trench. In some embodiments, a collinear III/V nano-ridge, which is uniform and has a pronounced (001) surface for device integration, may be obtained. Hence it may suitable for device integration. Moreover, a surfactant is not incorporated in a significant amount in the nano-ridge and only has an effect on the surface. Hence, it will not distort the normal operation of a device integrated in the nano-ridge.

The patterning of the trenches may be done in a dielectric layer 312 which is provided on the silicon substrate 310. This may be a silicon oxide layer ($SiO_2$). The thickness of the dielectric layer may for example be around 300 nm. The patterning 110 may be done through a shallow trench isolation process whereby one or more trenches are obtained in the dielectric layer 312. As explained above, defects are trapped in the trench. Therefore, in some embodiments, the width of the trench is smaller than the depth of the trench. The width of such a trench may for example range between 50 nm and 150 nm for a 300 nm thick dielectric layer but can be also larger for a thicker dielectric layer. Important is, that the aspect ratio (trench depth over trench width) is clearly larger than 1.43 to trap all misfit induced defects. The trenches are made through the dielectric layer meaning that through the trenches direct contact with the silicon substrate can be made. In some embodiments, the dielectric trenches may have a V-shaped silicon bottom to avoid anti-phase disorder in the III/V layer. The embodiments are, however, not limited thereto. The bottom may for example also be flat. As discussed above the trench is formed in a dielectric layer 312. In some embodiments, first, a filling layer 210 of the nano-ridge is grown inside the trench. Surfactants are added when the nano-ridge is growing out of the trench. This is when the nano-ridge is growing above the top surface of the dielectric layer 312. It may be a feature of some embodiments that the surfactants are added when the nano-ridge is growing out of the trench. In some embodiments, the surfactants may also be added when the nano-ridge is growing on top of the filling layer still inside the trench. The best moment to add the surfactant is, when the III/V layer is fully relaxed and all misfit induced defects are trapped at the side wall, which could be achieved still inside the trench pattern. Depending on the trench depth the moment when the III/V layer is fully relaxed may be when the filling layer is still inside the trench (for deeper trenches the point where the III/V layer is fully relaxed will be deeper inside the trench).

In some embodiments, the III/V nano-ridge comprises a binary and ternary material system comprising $In_xGa_{(1-x)}As$ wherein x goes from 0 to 1. In general the whole range from GaAs to InAs may be covered. In some embodiments, the composition of III/V materials is such that it comprises 50% (of the total atom percentage) group V and 50% group III materials. The group-III and -V may be considered as 100%. In some embodiments, the In concentration in the selection of group III materials goes from 0% to 100% (x goes from 0 to 1) and the Ga concentration in the selection of group III materials goes from 100% to 0% such that both together are at 100%. The As concentration in the selection of group V materials may for example be at 100%. In some embodiments, the nano-ridge may comprise two group III materials and two group V materials. For example P, Sb, and N may also be mixed in group V. Thus a quaternary III/V materials system may be formed. The following material systems may for example be formed (InGa)(AsP), (InGa)(AsSb), etc.

Different surfactants or combinations of surfactants may be used. As discussed before, these can, for example, be applied after depositing the filling layer (which may be deposited at low temperature). The precursors for the III-V nano-ridge overgrowth may for example be selected from the following list: triethylgallium (TEGa), trimethylgallium (TMGa), trimethylindium (TMIn), tertiarybutylarsine (TBAs), arsine gas (AsH$_3$), triethylantimony (TESb), trimethylantimony (TMSb) or even better trimethylgallium (TMGa), triethylantimony (TESb). The list may moreover comprise hydrogen chloride (HCl), carbon tetrabromide (CBr$_4$), or chlorine gas (Cl$_2$). In comparison to the other surfactants hydrogen chloride (HCl), chlorine gas (Cl$_2$) and carbon tetrabromide (CBr$_4$) etch the surface, but their impact with respect to the growth of the nano-ridge acts in the same ways as a surfactant as it changes the growth characteristics on the different nano-ridge facets. Other surfactants which may be used are bromochloromethanes (e.g. CCl$_3$Br, CCl$_2$Br$_2$ and CClBr$_3$), and carbon tetrachloride. These surfactants will also etch the surface. Other surfactants which may be used are Silicon surfactants such as monosilane and disilane.

Different technologies such as for example metal organic vapor phase epitaxy, or hydride vapor phase epitaxy, or molecular beam epitaxy may be used for growing the nano-ridges.

In the sections below typical ranges are listed for growth parameters for InGaAs growth covering the range from GaAs to InAs (In % from 0 to 100%) in accordance with an exemplary embodiment. In this exemplary method a 300 mm MOVPE chamber from Applied Materials is used. Depending on the MOVPE epi tool different parameter ranges may be required.

Trenches may be formed in a top layer of a silicon wafer. The layer may for example have a Si over oxide ratio from 1 to 50% or from 5 to 15%. The embodiments are, however, not limited thereto. Depending on the mask layout a different growth parameter range may be required.

In some embodiments, the surfactant may be added when continuing the growth out of the trench, such that nano-ridges with a flat surface may be formed at a higher temperature than would be the case if no surfactant would be used. The temperature may for example be above 500° C. The temperature may for example be above 525° C. It may for example be a temperature between 500° C. and 700° C. or between 525° C. and 625° C.

The carrier gas used in the MOVPE chamber may for example be N$_2$ or H$_2$. In this example the option is H$_2$.

In exemplary embodiments, the chamber pressure may for example range between 5 torr and 450 torr or between 10 torr and 150 torr.

In exemplary embodiments, the total carrier flow may range between 10 l/min and 30 l/min, or 15 l/min and 25 l/min.

The precursors for InGaAs overgrowth may be selected from the surfactants list specified above. The following precursor combinations may for example be made:

TMGa, TMIn, TBAs, TESb
TMGa, TMIn, TBAs, TMSb
TMGa, TMIn, AsH$_3$, TESb
TMGa, TMIn, AsH$_3$, TMSb
TEGa, TMIn, TBAs, TESb
TEGa, TMIn, TBAs, TMSb
TEGa, TMIn, AsH$_3$, TESb
TEGa, TMIn, AsH$_3$, TMSb

The applied mol-flux may for example range between the following values:

For TMGa, the mol-flux may for example range between 1.0E-5 and 2.0E-4 [mol/min] or 1.5E-5 and 1E-4 [mol/min] or, for TEGa, the mol-flux may for example range between 0.2E-5 and 2.0E-4 [mol/min], or between 1.0E-5 and 1E-4 [mol/min].

For TMIn, the mol-flux may for example range between 1.9E-5 and 1.9E-4 [mol/min] or between 3.8E-5 and 1.5E-4 [mol/min].

For TESb or TMSb, the mol-flux may for example range between 1.0E-5 and 6.5E-4 or 3.3E-5-3.2E-4 [mol/min].

The flux of the TBAs may be adjusted according to the Ga+In mol/min flux to meet a specific TBAs/(TMGa+TMIn) or TBAs/(TEGa+TMIn) ratio. This ratio may be between 5 and 200, or between 10 and 80.

The flux of AsH$_3$ is adjusted according to the Ga+In mol/min flux to meet a specific TBAs/(TMGa+TMIn) or TBAs/(TEGa+TMIn) ratio. This ratio may be between 50 and 1000, or between 50 and 500.

In some embodiments, the growth of the III/V nano-ridge is initiated by forming a seed and filling layer of the nano-ridge in the trench. The seed layer (III/V nucleation on the Si surface) may for example be done at 300° C. to 450° C. and the filling layer may for example be done at 350° C. to 500° C. The growth of for example InGaAs nano-ridges starts with the deposition of a thin InGaAs seed layer at low temperature followed by the filling layer. The seed layer needs to provide good wetting of the Si surface for the next layer and together with the filling layer compensates the lattice mismatch between the Si and InGaAs, but it does not affect the shape of the outgrown nano-ridge. After deposition of the seed and filling layer, the overgrowth 124 continues at a higher temperature to fill the trench and form the nano-ridge (overgrowth step). In some embodiments, the surfactant is used at this stage to manipulate the growth.

In the following section growth conditions are discussed for growing In0.55Ga0.45As. To demonstrate that the use of the surfactant leads to deposition of a funnel shaped or box shaped InGaAs nano-ridge, two experiments at identical growth conditions with and without use of TESb precursor acting as surfactant have been done. In these experiments the growth was conducted in 300 mm epitaxial chamber from Applied Materials and the used technique was metal organic vapor phase epitaxy (MOVPE). In this example the silicon substrates were STI (shallow trench isolation) wafers with about 10% open trench area (in other words, the ratio between Si-surface and SiO$_2$ surface was around 10%). The STI oxide thickness is about 300 nm. The temperature of the overgrowth was kept at 570° C., the operating pressure was kept at 50 torr, the total flux was kept at 20 standard liter per minute (slm) and the carrier gas was H$_2$. The precursors used for the InGaAs growth were TBAs, TMIn and TMGa. For formation of nano-ridges with ≈55% the TMGa mol flux was set to 3.4E-05 mol/min and the TMIn mol flux was set to 8.4E-05 mol/min. The TBAs mol flux was kept at 8.9E-03 mol/min, giving the TBAs/(TMGa+TMIn) ratio of 75.

Figure 4:
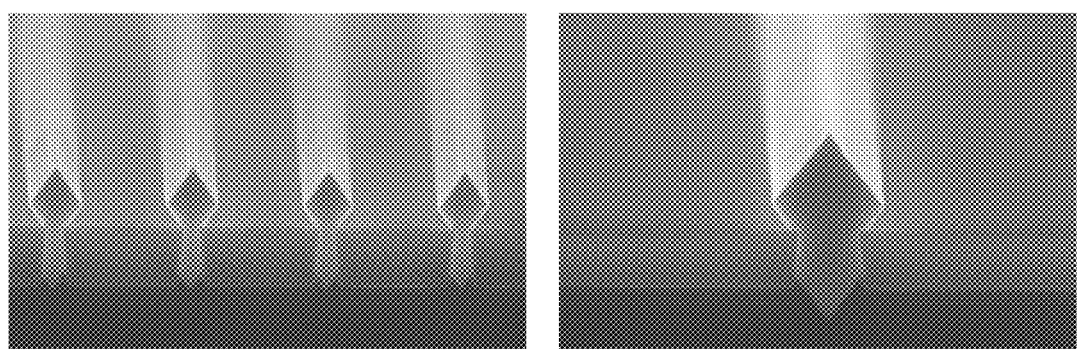
FIG. 4 shows cross-sectional SEM images of InGaAs nano-ridges outgrown of 80 nm trenches and of a 300 nm trench in accordance with an example embodiment.

Without the surfactant, the outgrown InGaAs material had {111} top facets as seen from the cross-sectional SEM images in FIG. 4. The left figure shows InGaAs nano-ridges outgrown of trenches with a width of 80 nm, and the right figure shows an InGaAs nano-ridge outgrown of a trench with a width of 300 nm.

Figure 5:
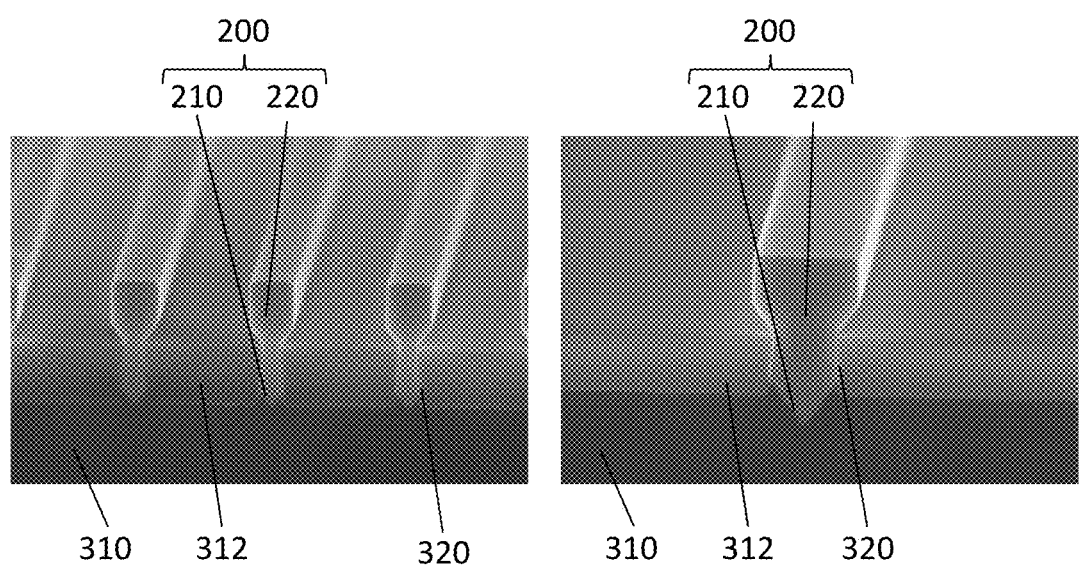
FIG. 5 shows cross-sectional SEM images of InGaAs nano-ridges outgrown of 80 nm trenches and of a 300 nm trench using a method in accordance with an example embodiment.

In some embodiments, during the high temperature growth, TESb flux of 2.4E-04 mol/min may be used, such that InGaAs nano-ridges with a box-shape profile may be grown. This is illustrated in FIG. 5. The left picture shows InGaAs nano-ridges 200 outgrown of 80 nm trenches 320. The right picture shows an InGaAs nano-ridge 200 outgrown of a 300 nm trench. In both figures the silicon substrate 310, the silicon oxide layer 312, and the trenches 320 on the silicon substrate 310 can be seen. The seed and filling layer 210 of the nano-ridges is formed in the trenches 320 and is in contact with the silicon substrate 310. It can be seen from the figures that the top parts 220 of the nano-ridges have a flat surface.

The X-ray diffraction ((224) reciprocal space mapping) results indicated formation with Sb of fully relaxed InGaAs with an In concentration of about 55%.

In some embodiments, high electron mobility transistors may be formed on a nano-ridge obtained using a method in accordance with present embodiments. These may for example be GaAs or InP or InGaAs (with different In-content) based. Such transistors may for example be employed in high-frequency applications.

In methods according to embodiments, RF devices, optical devices (e.g. lasers, DFB lasers, waveguides), or imagers may be formed in the at least one nano-ridge.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for growing at least one III/V nano-ridge on a silicon substrate in an epitaxial growth chamber, wherein the nano-ridge has a length along a longitudinal axis of the nano-ridge that is greater than each of a width and a height of the nano-ridge perpendicular to the longitudinal axis of the nano-ridge, the method comprising:
   patterning an area on a silicon substrate thereby forming a trench on the silicon substrate; and
   growing the at least one III/V nano-ridge, wherein growing the at least one III/V nano-ridge comprises:
      initiating growth of the at least one III/V nano-ridge in the trench, thereby forming a filling layer of the at least one III/V nano-ridge inside the trench; and
      continuing growth of the at least one III/V nano-ridge out of the trench on top of the filling layer by providing at least one group III precursor and at least one group V precursor in the epitaxial growth chamber, thereby forming a top part of the at least one III/V nano-ridge, wherein at least one surfactant is added in the chamber in addition to the at least one group III precursor and the at least one group V precursor when the III/V nano-ridge is growing out of the trench, thereby changing the growth characteristics of the III/V nano-ridge such that the III/V nano-ridge forms a flat (001) top surface, and wherein the at least one surfactant is added in the chamber subsequent to the trapping of all misfit induced defects in the III/V nano-ridge at the side walls of the trench such that the at least one surfactant is not added in the chamber when initiating growth of the at least one III/V nano-ridge in the trench or when forming a filling layer of the at least one III/V nano-ridge inside the trench.

2. The method according to claim 1, wherein the temperature in the epitaxial growth chamber is set to 400° C. or higher when continuing growth of the at least one III/V nano-ridge on top of the filling layer.

3. The method according to claim 2, wherein the at least one III/V nano-ridge is grown using metal organic vapor phase epitaxy.

4. The method according to claim 2, wherein the at least one III/V nano-ridge is grown using hydride vapor phase epitaxy.

5. The method according to claim 2, wherein the at least one III/V nano-ridge is grown using molecular beam epitaxy.

6. The method according to claim 2, wherein the at least one III/V nano-ridge comprises a ternary material system comprising $In_xGa_{(1-x)}As$ wherein x is a value between 0 and 1, 0 and 1 included.

7. The method according claim 2, wherein the at least one III/V nano-ridge comprises a quaternary material system.

8. The method according claim 2, wherein the at least one surfactant is selected from a list of surfactants, the list comprising one or more gallium-precursors, one or more indium precursors, tertiarybutylarsine, arsine gas, one or more antimony precursors, one or more bismuth precursors, one or more tellurium precursors, one or more zinc precursors, one or more magnesium precursors, one or more manganese precursors, one or more tin precursors, hydrogen chloride, carbon tetrabromide, chlorine gas, one or more bromochloromethanes, carbon tetrachloride.

9. The method according to claim 2, further comprising forming an RF device in the at least one nano-ridge.

10. The method according to claim 2, further comprising forming an optical device in the at least one nano-ridge.

11. The method according to claim 2, further comprising forming an imager in the at least one nano-ridge.

12. The method according to claim 1, wherein the at least one III/V nano-ridge is grown using metal organic vapor phase epitaxy.

13. The method according to claim 1, wherein the at least one III/V nano-ridge is grown using hydride vapor phase epitaxy.

14. The method according to claim 1, wherein the at least one III/V nano-ridge is grown using molecular beam epitaxy.

15. The method according to claim 1, wherein the at least one III/V nano-ridge comprises a ternary material system comprising $In_xGa_{(1-x)}As$ wherein x is a value between 0 and 1, 0 and 1 included.

16. The method according claim 1, wherein the at least one III/V nano-ridge comprises a quaternary material system.

17. The method according claim 1, wherein the at least one surfactant is selected from a list of surfactants, the list comprising one or more gallium-precursors, one or more indium precursors, tertiarybutylarsine, arsine gas, one or more antimony precursors, one or more bismuth precursors, one or more tellurium precursors, one or more zinc precursors, one or more magnesium precursors, one or more manganese precursors, one or more tin precursors, hydrogen chloride, carbon tetrabromide, chlorine gas, one or more bromochloromethanes, carbon tetrachloride.

18. The method according to claim 1, further comprising forming an RF device in the at least one nano-ridge.

19. The method according to claim 1, further comprising forming an optical device in the at least one nano-ridge.

20. The method according to claim 1, further comprising forming an imager in the at least one nano-ridge.

* * * * *